(12) United States Patent
Shishido et al.

(10) Patent No.: US 9,105,754 B2
(45) Date of Patent: Aug. 11, 2015

(54) ADHESIVE FILM, METHOD OF MANUFACTURING SEMICONDUCTOR DEVICE, AND SEMICONDUCTOR DEVICE

(71) Applicant: NITTO DENKO CORPORATION, Ibaraki-shi, Osaka (JP)

(72) Inventors: Yuichiro Shishido, Ibaraki (JP); Sadahito Misumi, Ibaraki (JP); Kenji Onishi, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 13/929,612

(22) Filed: Jun. 27, 2013

(65) Prior Publication Data
US 2014/0001654 A1    Jan. 2, 2014

(30) Foreign Application Priority Data
Jun. 28, 2012 (JP) ................................. 2012-145722

(51) Int. Cl.
*H01L 23/00* (2006.01)
*H01L 23/31* (2006.01)
(Continued)

(52) U.S. Cl.
CPC ............ *H01L 24/85* (2013.01); *H01L 23/3121* (2013.01); *H01L 24/42* (2013.01); *H01L 25/50* (2013.01); *H01L 24/16* (2013.01); *H01L 24/48* (2013.01); *H01L 25/03* (2013.01);
(Continued)

(58) Field of Classification Search
CPC ......... H01L 24/85; H01L 24/42; H01L 21/56; H01L 2924/181; H01L 23/28; H01L 23/3107

USPC ........................................... 257/778; 438/108
See application file for complete search history.

(56) References Cited

U.S. PATENT DOCUMENTS

2004/0213973 A1*  10/2004  Hara et al. ..................... 428/212
2006/0053607 A1*  3/2006  Onozawa ..................... 29/25.35
(Continued)

FOREIGN PATENT DOCUMENTS

JP    2007-096071    4/2007
JP    2008-098250    4/2008
(Continued)

OTHER PUBLICATIONS

Notification of Reasons for Refusal dated Aug. 28, 2013 in corresponding Japanese patent application No. 2012-145722.

*Primary Examiner* — Peniel M Gumedzoe
(74) *Attorney, Agent, or Firm* — Knobbe Martens Olson and Bear, LLP

(57) ABSTRACT

Provided is an adhesive film that enables manufacturing of a high quality semiconductor device with good yield ratio, and related methods of manufacturing a semiconductor device, and semiconductor devices. Provided is an adhesive film for embedding a first semiconductor element fixed to an adherend and fixing a second semiconductor element that is different from the first semiconductor element to the adherend, wherein the adhesive film has a thickness T that is larger than a thickness T1 of the first semiconductor element, and the adherend and the first semiconductor element are connected by wire bonding and a difference between the thickness T and the thickness T1 is 40 μm or more and 260 μm or less, or the adherend and the first semiconductor element are connected by flip-chip bonding and a difference between the thickness T and the thickness T1 is 10 μm or more and 200 μm or less.

10 Claims, 3 Drawing Sheets

(51) Int. Cl.
*H01L 25/00* (2006.01)
*H01L 25/03* (2006.01)

(52) U.S. Cl.
CPC .............. *H01L2224/16227* (2013.01); *H01L 2224/45124* (2013.01); *H01L 2224/45144* (2013.01); *H01L 2224/45147* (2013.01); *H01L 2224/48091* (2013.01); *H01L 2224/48227* (2013.01); *H01L 2224/73204* (2013.01); *H01L 2224/73265* (2013.01); *H01L 2224/814* (2013.01); *H01L 2224/81191* (2013.01); *H01L 2224/81815* (2013.01); *H01L 2224/85* (2013.01); *H01L 2224/92247* (2013.01); *H01L 2225/0651* (2013.01); *H01L 2225/06506* (2013.01); *H01L 2225/06517* (2013.01); *H01L 2225/06575* (2013.01)

(56) References Cited

U.S. PATENT DOCUMENTS

| | | | |
|---|---|---|---|
| 2008/0213943 A1 | 9/2008 | Takamoto et al. | |
| 2008/0308223 A1* | 12/2008 | Sakairi et al. | 156/275.5 |
| 2010/0239858 A1 | 9/2010 | Masuko et al. | |
| 2010/0261314 A1 | 10/2010 | Takamoto et al. | |
| 2011/0187009 A1 | 8/2011 | Masuko et al. | |
| 2012/0153513 A1* | 6/2012 | Toyoda et al. | 257/793 |

FOREIGN PATENT DOCUMENTS

| | | |
|---|---|---|
| JP | 2008-244464 | 10/2008 |
| JP | 2009-001635 | 1/2009 |
| JP | 2009-004433 | 1/2009 |
| JP | 2009-049400 | 3/2009 |
| JP | 2009-267321 | 11/2009 |
| JP | 2009-283905 | 12/2009 |
| JP | 2010-059387 | 3/2010 |
| JP | 2010-062553 | 5/2010 |
| JP | 2010-114433 | 8/2010 |
| JP | 2010-182816 | 10/2010 |
| JP | 2010-245395 | 10/2010 |
| JP | 2011-042729 | 3/2011 |
| JP | 2011-042730 | 3/2011 |
| JP | 2012-007130 | 1/2012 |
| JP | 2012-094586 | 5/2012 |
| WO | WO 2008/015759 | 2/2008 |
| WO | WO 2010/016305 | 2/2010 |

* cited by examiner

ADHESIVE FILM, METHOD OF MANUFACTURING SEMICONDUCTOR DEVICE, AND SEMICONDUCTOR DEVICE

BACKGROUND OF THE INVENTION

1. Field of the Invention

The present invention relates to an adhesive film, a method of manufacturing a semiconductor device, and a semiconductor device.

2. Description of the Related Art

In recent years, higher functionality, thinning, and downsizing of semiconductor devices and packages thereof have been desired increasingly. As one idea, a three-dimensional mounting technique has been developed, in which a plurality of semiconductor elements are laminated in layers in the thickness direction to achieve high-density integration.

As a general three-dimensional mounting method, a procedure has been adopted in which a semiconductor element is fixed to an adherend such as a substrate, and semiconductor elements are laminated one by one on the lowermost semiconductor element. An electrical connection is established between the semiconductor elements and between the semiconductor element and the adherend by a bonding wire (hereinafter, sometimes referred to as a "wire"). A film-like adhesive or a liquid adhesive has been broadly used to fix the semiconductor element.

In such a semiconductor device, a semiconductor element for controlling (hereinafter, sometimes referred to as a "controller") is arranged on the uppermost semiconductor element for controlling the individual operation of a plurality of semiconductor elements and controlling communication between the semiconductor elements, for example (JP-A-2007-096071).

SUMMARY OF THE INVENTION

An electrical connection is established between the controller and the adherend by a wire in the same way as in the lower semiconductor elements. However, the distance between the controller and the adherend becomes longer and the wire necessary for the electrical connection becomes longer as the number of the laminated layers of the semiconductor elements increases. As a result, the communication speed of the semiconductor package may decrease, the quality of the semiconductor package may degrade because of a failure of the wire generated by external factors such as heat and shock, or the yield ratio of the semiconductor device manufacturing may decrease because of the complex wire bonding step.

The present invention was made in view of the above-described problems, and an object thereof is to provide an adhesive film that enables manufacturing of a high quality semiconductor device with good yield ratio, a method of manufacturing a semiconductor device using the same, and a semiconductor device obtained by the manufacturing method.

The present inventors intensively investigated the arrangement of each element of the semiconductor device and the structure of the adhesive film so as to solve the conventional problems. As a result, they found that the object can be achieved by adopting the following configuration, and completed the present invention.

The present invention provides an adhesive film for embedding a first semiconductor element fixed to an adherend and fixing a second semiconductor element that is different from the first semiconductor element to the adherend (hereinafter, sometimes referred to as an "adhesive film for embedding"), wherein the adhesive film has a thickness T that is larger than the thickness $T_1$ of the first semiconductor element, and the adherend and the first semiconductor element are connected by wire bonding and the difference between the thickness T and the thickness $T_1$ is 40 µm or more and 260 µm or less, or the adherend and the first semiconductor element are connected by flip-chip bonding and the difference between the thickness T and the thickness $T_1$ is 10 µm or more and 200 µm or less.

The adhesive film can embed inside the first semiconductor element of the controller or the like that is fixed to the adherend and can fix the second semiconductor element that is different from the first semiconductor element to the adherend. Because the first semiconductor element can be fixed to the lowermost adherend by using the adhesive film, the length of the wire necessary for the electrical connection can be decreased, a decrease of the communication speed of the semiconductor package can be prevented, and generation of failures of the wire due to external factors can be decreased. The adhesive film has a thickness T that is larger than the thickness $T_1$ of the first semiconductor element, and a difference between the thickness T and the thickness $T_1$ is 40 µm or more and 260 µm or less when the adherend and the first semiconductor element are connected by wire bonding, or a difference between the thickness T and the thickness $T_1$ is 10 µm or more and 200 µm or less when the adherend and the first semiconductor element are connected by an electrically conductive adhesive composition or flip-chip bonding, therefore, the first semiconductor element can be embedded suitably in accordance with the connection form between the first semiconductor element and the adherend. Because the first semiconductor element can be embedded under a condition where the distance between the first semiconductor element and the adherend becomes the shortest due to the adhesive film, wire bonding between the first semiconductor element and the adherend becomes easy, and with this, the yield ratio of the semiconductor device manufacturing can be improved. When the adherend and the first semiconductor element are connected by flip-chip bonding, the wire bonding step itself can be omitted, and the yield ratio of the semiconductor device manufacturing can be improved more.

When the adherend and the first semiconductor element are connected by wire bonding, the thickness T is preferably 80 µm or more and 300 µm or less. When the adherend and the first semiconductor element are connected by flip-chip bonding, the thickness T is preferably 50 µm or more and 250 µm or less. By making the adhesive film relatively thick, the thickness of a general controller can be almost covered, and the first semiconductor element can be easily embedded in the adhesive film.

The melt viscosity of the adhesive film at 120° C. is preferably 100 Pa·S or more and 2000 Pa·S or less. With this, the first semiconductor element can be easily embedded in the adhesive film when the second semiconductor element is fixed to the adherend with the adhesive film. The method of measuring the melt viscosity is described in the Examples.

The present invention also includes a method of manufacturing a semiconductor device, including a first fixing step of fixing at least one first semiconductor element onto an adherend, and a second fixing step of fixing a second semiconductor element that is different from the first semiconductor element to the adherend while embedding the first semiconductor element with the adhesive film.

According to the above-described manufacturing method, the first semiconductor element such as a controller or the like can be fixed to the adherend by using the adhesive film. Therefore, the length of the wire necessary for the electrical connection can be decreased, and with this, a decrease of the communication speed of the semiconductor package can be prevented, and a high quality semiconductor device can be manufactured in which generation of failures of the wire due to external factors is decreased. In the manufacturing method, because the first semiconductor element can be embedded on the adherend by using the adhesive film, wire bonding between the first semiconductor element and the adherend becomes easy, and with this, the yield ratio of the semiconductor device manufacturing can be improved.

In the first fixing step of the manufacturing method, the first semiconductor element may be fixed to the adherend with a first adhesive film for fixing the first semiconductor element. In this case, it is preferable to further include a wire bonding step of electrically connecting the first semiconductor element and the adherend by a bonding wire.

In the first fixing step of the manufacturing method, the first semiconductor element may also be fixed to the adherend by flip-chip bonding.

In the manufacturing method, by further including a third fixing step of fixing a third semiconductor element that is of the same type with or a different type from the second semiconductor element onto the second semiconductor element, multistage lamination of the semiconductor elements becomes possible, and a highly integrated semiconductor device can be manufactured.

the present invention also includes a semiconductor device obtained by the method of manufacturing a semiconductor device.

Because the first semiconductor element that is fixed to the adherend can be embedded and the second semiconductor element can be fixed above the first semiconductor element by using the adhesive film of the present invention, the length of the wire necessary for the electrical connection between the first semiconductor element and the adherend can be decreased. With this, a decrease of the communication speed of the semiconductor device can be prevented, and a high quality semiconductor device can be manufactured in which generation of failures of the wire due to external factors is decreased. Concurrently, in the case of performing wire bonding to the first semiconductor element, the operation becomes simple. Therefore, the yield ratio of the semiconductor device manufacturing can be improved.

DETAILED DESCRIPTION OF THE PREFERRED EMBODIMENTS

First Embodiment

Figure 1A:
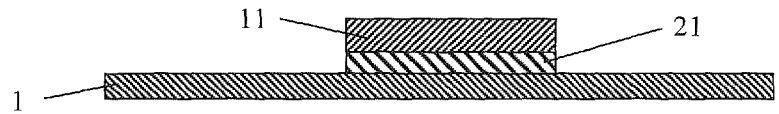
FIGS. 1A to 1E are sectional views schematically showing each step of the method of manufacturing a semiconductor device according to one embodiment of the present invention.

A first embodiment of the present invention is explained below by referring to the drawings. In a part of or the entire drawings, some parts that are unnecessary for the explanation are omitted, and some parts are shown enlarged or shrunken to make the explanation easy. In the first embodiment, a mode is explained in which the adherend and the first semiconductor element are electrically connected by wire bonding. First, the adhesive film is explained, and then a method of manufacturing a semiconductor device using the adhesive film is explained.

<Adhesive Film>

The configuration of the adhesive film is not especially limited, and examples thereof include an adhesive film made only of a single layer of an adhesive film and an adhesive film having a multilayered structure in which adhesive film(s) are formed on one surface or both surfaces of a core material. Examples of the core material include films such as a polyimide film, a polyester film (a polyethylene terephthalate film, a polyethylene naphthalate film), and a polycarbonate film; resin substrates reinforced with a glass fiber or a plastic nonwoven fiber; a silicon substrate; and a glass substrate. Further, an integrated film of an adhesive film and a dicing sheet can also be used.

The adhesive film is a layer having an adhesive function, and an example of a constituent material thereof is a material in which a thermoplastic resin and a thermosetting resin are used together. Alternatively, a thermoplastic resin can be used alone.

(Thermoplastic Resin)

Examples of the thermoplastic resin include a natural rubber, a butyl rubber, an isoprene rubber, a chloroprene rubber, an ethylene-vinyl acetate copolymer, an ethylene-acrylic acid copolymer, an ethylene-acrylic ester copolymer, a polybutadiene resin, a polycarbonate resin, a thermoplastic polyimide resin, polyamide resins such as 6-nylon and 6,6-nylon, a phenoxy resin, an acrylic resin, saturated polyester resins such as PET and PBT, a polyamideimide resin, and a fluororesin. The thermoplastic resins can be used alone or two or more of them can be used together. Of these thermoplastic resins, an acrylic resin is particularly preferable since the resin contains only a small amount of ionic impurities and has high heat resistance so as to make it possible to ensure the reliability of the semiconductor element.

The acrylic resin is not especially limited, and examples thereof include a polymer including as a component one or more of acrylates or methacrylates having a linear or branched alkyl group having 30 or less carbon atoms, especially 4 to 18 carbon atoms. Examples of the alkyl group include a methyl group, an ethyl group, a propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl group, and a eicosyl group.

Other monomers that can form the above-described polymer are not especially limited. Examples thereof include carboxyl group-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic anhydride; hydroxyl group-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxymethylcyclohexyl)methylacrylate; sulfonic acid group-containing monomers such as styrenesulfonic acid, allylsulfonic acid, 2-(meth)acrylamide-2-methylpropanesulfonic acid, (meth)acrylamidepropane sulfonic acid, sulfopropyl(meth)acrylate, and (meth)acryloyloxynaphthalenesulfonic acid; and phosphoric acid group-containing monomers such as 2-hydroxyethylacryloyl phosphate.

(Thermosetting Resin)

Examples of the thermosetting resin include a phenol resin, an amino resin, an unsaturated polyester resin, an epoxy resin, a polyurethane resin, a silicone resin, and a thermosetting polyimide resin. The thermosetting resins can be used alone or two or more of them can be used together. An epoxy resin in which an amount of ionic impurities that erode the semiconductor element is small is preferable. Further, a phenol resin is preferable as a curing agent for the epoxy resin.

The epoxy resin is not especially limited as long as it is generally used as an adhesive composition, and examples thereof include bifunctional epoxy resins and polyfunctional epoxy resins such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a biphenyl type epoxy resin, a naphthalene type epoxy resin, a fluorene type epoxy resin, a phenol novolak type epoxy resin, an ortho-cresol novolak type epoxy resin, a trishydroxyphenylmethane type epoxy resin, and a tetraphenylolethane type epoxy resin, a hydantoin type epoxy resin, a trisglycidylisocyanurate type epoxy resin, and a glycidylamine type epoxy resin. These can be used alone or two or more of them can be used together. Among these epoxy resins, a novolak type epoxy resin, a biphenyl type epoxy resin, a trishydroxyphenylmethane type epoxy resin, and a tetraphenylolethane type epoxy resin are especially preferable. This is because these epoxy resins are highly reactive with a phenol resin as a curing agent and are excellent in heat resistance.

The phenol resin acts as a curing agent for the epoxy resin, and examples thereof include novolak type phenol resins such as a phenol novolak resin, a phenol aralkyl resin, a cresol novolak resin, a tert-butylphenol novolak resin, and a nonylphenol novolak resin, a resol type phenol resin, and polyoxystyrenes such as polyparaoxystyrene. These can be used alone or two or more of them can be used together. Among these phenol resins, a phenol novolak resin and a phenol aralkyl resin are especially preferable. This is because connection reliability of the semiconductor device can be improved.

It is preferable that the phenol resin is suitably compounded in the epoxy resin so that a hydroxyl group equivalent in the phenol resin to 1 equivalent of epoxy groups in the epoxy resin component becomes 0.5 equivalents to 2.0 equivalents. The ratio is more preferably 0.8 equivalents to 1.2 equivalents. When the compounding ratio falls out of this range, a curing reaction does not sufficiently proceed, and the characteristics of the epoxy resin cured substance easily deteriorate.

In the present embodiment, an adhesive film containing an epoxy resin, a phenol resin, and an acrylic resin is especially preferable. Because these resins contain only a small amount of ionic impurities and have high heat resistance, the reliability of the semiconductor element can be ensured. For a compounding ratio, in this case, the mixing amount of an epoxy resin and a phenol resin is 10 to 200 parts by weight to 100 parts by weight of the acrylic resin component.

(Crosslinking Agent)

Because the adhesive film of the present embodiment is crosslinked to some extent in advance, a polyfunctional compound that reacts with a functional group and the like at the end of a molecular chain of the polymer is preferably added as a crosslinking agent at production. With this addition, adhering property at high temperature can be improved and heat resistance can be improved.

A conventionally known crosslinking agent can be used as the crosslinking agent. Especially, polyisocyanate compounds such as tolylene diisocyanate, diphenylmethane diisocyanate, p-phenylene diisocyanate, 1,5-naphthalene diisocyanate, and an adduct of a polyalcohol and diisocyanate are more preferable. The amount of addition of the crosslinking agent is normally preferably 0.05 to 7 parts by weight to 100 parts by weight of the polymer. When the amount of the crosslinking agent is more than 7 parts by weight, it is not preferable because the adhering strength decreases. When the amount of the crosslinking agent is less than 0.05 parts by weight, it is not preferable because the cohesive strength becomes insufficient. Other polyfunctional compounds such as an epoxy resin may be included together with the polyisocyanate compound as necessary.

(Inorganic Filler)

An inorganic filler can be appropriately compounded in the adhesive film of the present embodiment depending on the use. By adding an inorganic filler, electric conductivity can be given to the film, heat conductivity can be improved, and the elastic modulus can be adjusted. Examples of the inorganic filler include ceramics such as silica, clay, gypsum, calcium carbonate, barium sulfate, alumina oxide, beryllium oxide, silicon carbide, and silicon nitride, metals such as aluminum, copper, silver, gold, nickel, chromium, tin, zinc, palladium, and solder, alloys, and various inorganic powders of carbon or the like. These can be used alone or two or more of them can be used together. Among these, silica, especially molten silica is preferable. The generation of static electricity can be suppressed by making the adhesive film be electrically conductive by adding electrically conductive fine particles formed of aluminum, copper, silver, gold, nickel, chromium, tin, zinc, or the like. The average particle size of the inorganic filler is preferably 0.1 to 80 μm.

The compounding amount of the inorganic filler is preferably set to 0 to 80% by weight to 100 parts by weight of the organic resin component. Especially preferably, the amount is 0 to 70% by weight.

(Thermal Curing Catalyst)

A thermal curing catalyst may be used as a constituent material of the adhesive film. The content thereof is preferably 0.01 to 1 part by weight and more preferably 0.05 to 0.5 parts by weight to 100 parts by weight of the organic component. By setting the content to the above-described lower limit or more, the epoxy groups that are unreacted at die bonding are polymerized in the subsequent step to decrease or eliminate the unreacted epoxy groups. As a result, a semiconductor device can be manufactured in which a semiconductor element is adhered and fixed to an adherend without peeling off. By setting the compounding ratio to the above-described upper limit or less, generation of curing inhibition can be prevented.

The thermal curing catalyst is not especially limited, and examples thereof include an imidazole-based compound, a triphenylphosphine-based compound, an amine-based compound, a triphenylborane-based compound, and a trihalogenborane-based compound. These can be used alone or two or more of them can be used together.

Examples of the imidazole-based compound include 2-methylimidazole (trade name: 2MZ), 2-undecylimidazole (trade name: C11Z), 2-heptadecylimidazole (trade name: C17Z), 1,2-dimethylimidazole (trade name: 1.2DMZ), 2-ethyl-4-methylimidazole (trade name: 2E4MZ), 2-phenylimidazole (trade name: 2PZ), 2-phenyl-4-methylimidazole (trade name: 2P4MZ), 1-benzyl-2-methylimidazole (trade name: 1B2MZ), 1-benzyl-2-phenylimidazole (trade name: 1B2PZ), 1-cyanoethyl-2-methylimidazole (trade name: 2MZ-CN), 1-cyanoethyl-2-undecylimidazole (trade name: C11Z-CN), 1-cyanoethyl-2-phenylimidazolium trimellitate (trade name: 2PZCNS-PW), 2,4-diamino-6-[2'-methylimidazolyl-(1')]-ethyl-s-triazine (trade name: 2MZ-A), 2,4-diamino-6-[2'-undecylimidazolyl-(1')]-ethyl-s-triazine (trade name: C11Z-A), 2,4-diamino-6-[2'-ethyl-4'-methylimidazolyl-(1')]-ethyl-s-triazine (trade name: 2E4MZ-A), 2,4-diamino-6-[2'-methylimidazolyl-(1')]-ethyl-s-triazine isocyanuric acid adduct (trade name: 2MA-OK), 2-phenyl-4,5-dihydroxymethylimidazole (trade name: 2PHZ-PW), and 2-phenyl-4-methyl-5-hydroxymethylimidazole (trade name: 2P4 MHZ-PW) (all are manufactured by Shikoku Chemicals Corporation).

The triphenylphosphine-based compound is not especially limited, and examples thereof include triorganophosphines such as triphenylphosphine, tributylphosphine, tri(p-methylphenyl)phosphine, tri(nonylphenyl)phosphine, and diphenyltolylphosphine; tetraphenylphosphoniumbromide (trade name: TPP-PB), methyltriphenylphosphonium (trade name: TPP-MB), methyltriphenylphosphonium chloride (trade name: TPP-MC), methoxymethyltriphenylphosphonium (trade name: TPP-MOC), and benzyltriphenylphosphonium chloride (trade name: TPP-ZC) (all are manufactured by Hokko Chemical Industry Co., Ltd.). The triphenylphosphine-based compound is preferably substantially insoluble in the epoxy resin. When the triphenylphosphine-based compound is insoluble in the epoxy resin, excessive progress of the thermal curing can be suppressed. Examples of the thermal curing catalyst having a triphenylphosphine structure and that is substantially insoluble in the epoxy resin include methyltriphenylphosphonium (trade name: TPP-MB). "Insoluble" means that the thermal curing catalyst made of a triphenylphosphine-based compound is insoluble in a solvent made of an epoxy resin. More specifically, it means that not more than 10% by weight of the catalyst is soluble in the solvent at a temperature of 10 to 40° C.

The triphenylborane-based compound is not especially limited, and examples thereof include tri(p-methylphenyl)phosphine. A compound having a triphenylphosphine structure is also included in the triphenylborane-based compound. The compound having a triphenylphosphine structure and a triphenylborane structure is not especially limited, and examples thereof include tetraphenylphosphonium tetraphenylborate (trade name: TPP-K), tetrtaphenylphosphoniumtetra-p-triborate (tradename: TPP-MK), benzyltriphenylphosphonium tetraphenylborate (trade name: TPP-ZK), and triphenylphosphine triphenylborane (trade name: TPP-S) (all are manufactured by Hokko Chemical Industry Co., Ltd.).

The amino-based compound is not especially limited, and examples thereof include monoethanolamine trifluoroborate (manufactured by Stella Chemifa Corporation) and dicyandiamide (manufactured by Nacalai Tesque, Inc.).

The trihalogenborane-based compound is not especially limited, and examples thereof include trichloroborane.

(Other Additives)

Other additives can be appropriately compounded as necessary in the adhesive film of the present embodiment in addition to the inorganic filler. Examples of other additives include a flame retardant, a silane coupling agent, and an ion trapping agent.

Examples of the flame retardant include antimony trioxide, antimony pentoxide, and a brominated epoxy resin. These can be used alone or two or more of them can be used together.

Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These compounds can be used alone or two or more of them can be used together.

Examples of the ion trapping agent include hydrotalcites and bismuth hydroxide. These can be used alone or two or more of them can be used together.

The melt viscosity of the adhesive film at 120° C. is not especially limited as long as it has an embedding property of the first semiconductor element. However, the lower limit thereof is preferably 100 Pa·S or more, more preferably 200 Pa·S or more, and further preferably 500 Pa·S or more. The upper limit of the melt viscosity is preferably 2000 Pa·S or less, more preferably 1500 Pa·S or less, and further preferably 1000 Pa·S or less. With such a melt viscosity, the first semiconductor element can be more easily embedded in the adhesive film when the second semiconductor element is fixed to the adherend with the adhesive film.

(Method of Manufacturing Adhesive Film)

The adhesive film according to the present embodiment is manufactured as follows, for example. First, an adhesive composition for forming an adhesive film is prepared. The preparation method is not especially limited, and the adhesive composition can be obtained as an adhesive composition solution by placing the thermosetting resin, the thermoplastic resin, and other additives that are explained in the section of adhesive film in a container, dissolving them in an organic solvent, and stirring the resultant so as to make the solution uniform.

The organic solvent is not limited as long as it enables uniform dissolution, kneading, or dispersing of the component constituting the adhesive film, and a conventionally known solvent can be used. Examples of the solvent include dimethylformamide, dimethylacetamide, N-methylpyrrolidone, ketone-based solvents such as acetone, methylethylketone, and cyclohexanone, toluene, and xylene. Methylethylketone, cyclohexanone, and the like are preferably used from the viewpoint that they can be quickly dried and are inexpensive.

The prepared adhesive composition solution is applied onto a base separator to a prescribed thickness to form a coating film, and the coating film is dried under a prescribed condition. Examples of the base separator include polyethylene terephthalate (PET), polyethylene, polypropylene, a plastic film whose surface is coated with a release agent such as a fluorine release agent or a long chain alkylacrylate release agent, and paper. The applying method is not especially limited, and examples thereof include roll coating, screen coating, and gravure coating. The drying conditions are a drying temperature of 70 to 160° C. and a drying time of 1 to 5 minutes. With this operation, the adhesive film according to the present embodiment can be obtained.

<Method of Manufacturing Semiconductor Device>

The method of manufacturing a semiconductor device according to the present embodiment includes a first fixing step of fixing at least one first semiconductor element onto the adherend using a first adhesive film for fixing a first semiconductor element, a first wire bonding step of electrically connecting the first semiconductor element and the adherend by a bonding wire, and a second fixing step of fixing a second semiconductor element that is different from the first semiconductor element to the adherend while embedding the first semiconductor element with the adhesive film. The present embodiment also includes a third fixing step of fixing a third semiconductor element that is of the same type with or a different type from the second semiconductor element onto the second semiconductor element and a second wire bonding step of electrically connecting the second semiconductor element and the third semiconductor element by a bonding wire. Each of FIGS. 1A to 1E is a sectional view schematically showing one step of the method of manufacturing a semiconductor device according to one embodiment of the present invention.

(First Fixing Step)

As shown in FIG. 1, at least one first semiconductor element 11 is fixed to an adherend 1 in a first fixing step. The first semiconductor element 11 is fixed to the adherend 1 with a first adhesive film 21 interposed therebetween. Although only one first semiconductor element 11 is shown in FIG. 1, two, three, four, or five or more first semiconductor elements 11 may be fixed to the adherend 1 in accordance with the specification of the objective semiconductor device.

(First Semiconductor Element)

The first semiconductor element 11 is not especially limited as long as it has a smaller plan-view dimension than that of a semiconductor element (second semiconductor element 12, see FIG. 1C) that is laminated as a second layer, and for example, a controller that is one type of the semiconductor element, a memory chip and a logic chip can be suitably used. Because the controllers control the operation of each semiconductor element laminated, a plurality of wires are generally connected. The communication speed of a semiconductor package is affected by the wire length. Because the first semiconductor element 11 is fixed to the adherend 1 and located on the lowermost layer in the present embodiment, the wire length can be made short, and accordingly, a decrease of the communication speed of the semiconductor package (semiconductor device) can be suppressed even if the lamination number of the semiconductor elements is increased.

The thickness of the first semiconductor element 11 is not especially limited. However, it is generally often 100 μm or less. The first semiconductor element 11 having a thickness of 75 μm or less, further 50 μm or less is used in association with thinning of the semiconductor package in recent years.

(Adherend)

Examples of the adherend 1 include a substrate, a lead frame, and other semiconductor elements. A conventionally known substrate such as a printed circuit board can be used as the substrate. A metal lead frame such as a Cu lead frame or a 42 Alloy lead frame and an organic substrate made of glass epoxy, BT (bismaleimide-triazine), or polyimide can be used as the lead frame. However, the present embodiment is not limited to them, and also includes a circuit board that can be used to mount a semiconductor element thereon and to electrically connect the semiconductor element thereto.

(First Adhesive Film)

As the first adhesive film 21, the adhesive film for embedding may be used or a conventionally known adhesive film for fixing a semiconductor element may be used. When the adhesive film for embedding is used, it is not necessary to embed the semiconductor element with the first adhesive film 21. Therefore, a thin adhesive film for embedding having a thickness of about 5 to 60 μm can be used.

(Fixing Method)

As shown in FIG. 1A, the first semiconductor element 11 is die bonded to the adherend 1 with the first adhesive film 21 interposed therebetween. An example of a method of fixing the first semiconductor element 11 onto the adherend 1 is a method of laminating the first adhesive film 21 onto the adherend 1 and then laminating the first semiconductor element 11 onto the first adhesive film 21 so that the wire bonding surface faces upward. The first semiconductor element 11 to which the first adhesive film 21 is pasted in advance may be arranged and laminated on the adherend 1.

Because the first adhesive film 21 is in a semi-cured state, the first adhesive film 21 is placed onto the adherend 1, and then a heat treatment is performed under a prescribed condition to thermally cure the first adhesive film 21 and fix the first semiconductor element 11 onto the adherend 1. The temperature for performing the heat treatment is preferably 100 to 200° C. and more preferably 120 to 180° C. The heat treatment time is preferably 0.25 to 10 hours and more preferably 0.5 to 8 hours.

(First Wire Bonding Step)

Figure 1B:
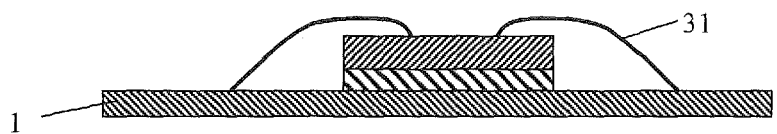

The first wire bonding step is a step of electrically connecting the tip of the terminal such as an inner lead of the adherend 1 and an electrode pad (not shown in the drawings) on the first semiconductor element 11 by a bonding wire 31 (see FIG. 1B). Examples of the bonding wire 31 include a gold wire, an aluminum wire, and a copper wire. The temperature of wire bonding is 80 to 250° C. and preferably 80 to 220° C. The heating time is a few seconds to a few minutes. The wire bonding is performed by using together a vibration energy of ultrasonic waves and a press-bonding energy of an applied pressure while heating so that the temperature falls within the above-described range.

(Second Fixing Step)

Figure 1C:
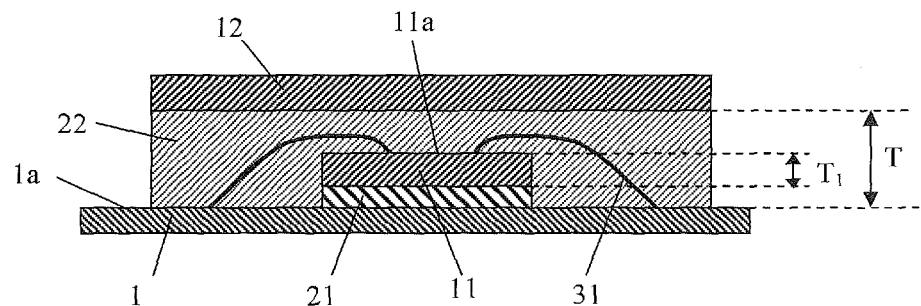

In the second fixing step, a second semiconductor element 12 that is different from the first semiconductor element 11 is fixed to the adherend 1 while embedding the first semiconductor element 11 with an adhesive film 22 for embedding (see FIG. 1C). The adhesive film 22 for embedding has a thickness T that is larger than a thickness $T_1$ of the first semiconductor element 11. Because the electrical connection between the adherend 1 and the first semiconductor element 11 is achieved by wire bonding connection in the present embodiment, the difference between the thickness T and the thickness $T_1$ is 40 μm or more and 260 μm or less. The lower limit of the difference between the thickness T and the thickness $T_1$ is not especially limited as long as it is 40 μm or more. However, it is preferably 50 μm or more, and more preferably 60 μm or more. The upper limit of the difference between the thickness T and the thickness $T_1$ is not especially limited as long as it is 260 μm or less. However, it is preferably 200 μm or less, and more preferably 150 μm or less. With such a difference, the entire first semiconductor element 11 can be embedded inside of the adhesive film 22 for embedding while preventing contact between the first semiconductor element 11 and the second semiconductor element 12, and the first semiconductor element 11 as a controller can be fixed onto the adherend 1 (that is, fixed to the lowermost layer where the wire length becomes shortest), together with thinning of the entire semiconductor device.

The thickness T of the adhesive film 22 for embedding can be appropriately set in consideration of the thickness $T_1$ of the first semiconductor element 11 and the protruding amount of wire so that the first semiconductor element 11 can be embedded. However, the lower limit thereof is preferably 80 μm or more, more preferably 100 μm or more, and further preferably 120 μm or more. The upper limit of the thickness T is preferably 300 μm or less, more preferably 200 μm or less, and further preferably 150 μm or less. By making the adhesive film relatively thick, the thickness of a general controller can be almost covered, and the first semiconductor element 11 can be easily embedded in the adhesive film 22 for embedding.

(Second Semiconductor Element)

The second semiconductor element 12 is not especially limited, and a memory chip that receives operation control of the first semiconductor element 11 as a controller can be used, for example.

(Fixing Method)

An example of a method of fixing the second semiconductor element 12 onto the adherend 1 is a method of laminating the adhesive film 22 for embedding onto the adherend 1 and then laminating the second semiconductor element 12 onto the adhesive film 22 for embedding so that the wire bonding surface faces upward similarly to the first fixing step. The second semiconductor element 12 to which the adhesive film 22 for embedding is pasted in advance may be arranged and laminated on the adherend 1.

A heat treatment may be performed on the adhesive film 22 for embedding upon die bonding to make approaching and embedding of the first semiconductor element 11 into the adhesive film 22 for embedding easy. The heating temperature may be a temperature at which the adhesive film 22 for embedding softens and is not completely thermally cured, and is preferably 80° C. or more and 150° C. or less, and more preferably 100° C. or more and 130° C. or less. A pressure of 0.1 MPa or more and 1.0 MPa or less may be applied at this time.

Because the first adhesive film 22 for embedding is in a semi-cured state, the adhesive film 22 for embedding is placed onto the adherend 1, and then a heat treatment is performed under a prescribed condition to thermally cure the adhesive film 22 for embedding and fix the second semiconductor element 12 onto the adherend 1. The temperature for performing the heat treatment is preferably 100 to 200° C. and more preferably 120 to 180° C. The heat treatment time is preferably 0.25 to 10 hours and more preferably 0.5 to 8 hours.

The shear adhering strength of the adhesive film 22 for embedding after thermal curing to the adherend 1 at 25 to 250° C. is preferably 0.1 MPa or more and more preferably 0.2 to 10 MPa. When the shear adhering strength of the adhesive film 22 for embedding is 0.1 MPa or more, generation of shear deformation at the adhering surface of the adhesive film 22 for embedding and the second semiconductor element 12 or the adherend 1 due to the ultrasonic vibration and heating in the wire bonding step for the second semiconductor element 12 can be suppressed. The movement of the second semiconductor element 12 due to the ultrasonic vibration during wire bonding can be suppressed. With this, a decrease of the success rate of wire bonding can be prevented.

(Third Fixing Step)

Figure 1D:
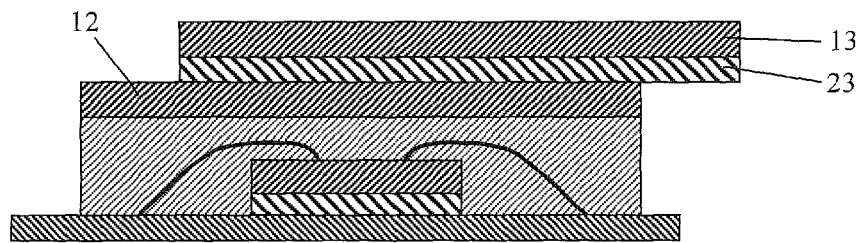

In the third fixing step, a third semiconductor element 13 that is of the same type with or a different type from the second semiconductor element is fixed onto the second semiconductor element 12 (see FIG. 1D). The third semiconductor element 13 is fixed to the second semiconductor element 12 with the third adhesive film 23 interposed therebetween.

(Third Semiconductor Element)

The third semiconductor element 13 may be a memory chip of the same type as the second semiconductor element 12 or a memory chip of a different type from the second semiconductor element 12. The thickness of the third semiconductor element 13 can be appropriately set in accordance with the specification of the objective semiconductor device.

(Third Adhesive Film)

The same adhesive film as the first adhesive film 21 in the first fixing step can be suitably used as the third adhesive film 23. When the adhesive film 22 for embedding is used as the third adhesive film 23, embedding of other semiconductor elements is not necessary. Therefore, a thin adhesive film for embedding having a thickness of about 5 to 60 μm can be used.

(Fixing Method)

As shown in FIG. 1D, the third semiconductor element 13 is die bonded to the second semiconductor element 12 with the third adhesive film 23 interposed therebetween. An example of a method of fixing the third semiconductor element 13 onto the second semiconductor element 12 is a method of laminating the third adhesive film 23 onto the second semiconductor element 12 and then laminating the third semiconductor element 13 onto the third adhesive film 23 so that the wire bonding surface faces upward. The third semiconductor element 13 to which the third adhesive film 23 is pasted in advance may be arranged and laminated on the second semiconductor element 12. However, in some cases, the third semiconductor element 13 is fixed with shift from the second semiconductor element 12 so that it avoids an electrode pad on the wire bonding surface (upper surface) of the second semiconductor element 12 for wire bonding between the second semiconductor element 12 and the third semiconductor element 13 described later. In this case, when the third adhesive film 23 is pasted to the upper surface of the second semiconductor element 12 in advance, a portion (a so-called over hanging portion) of the third adhesive film 23 that is protruded from the upper surface of the second semiconductor element 12 may be bent and the protruded portion attaches the sides of the second semiconductor element 12 or the adhesive film 22 for embedding to possibly generate unexpected failures. Therefore, in the third fixing step, it is preferable that the third adhesive film 23 be pasted to the third semiconductor element 13 in advance and the laminate is arranged and laminated on the second semiconductor element 12.

Because the third adhesive film 23 is also in a semi-cured state, the third adhesive film 23 is placed onto the second semiconductor element 12, and then a heat treatment is performed under a prescribed condition to thermally cure the third adhesive film 23 and fix the third semiconductor element 13 onto the second semiconductor element 12. The third semiconductor element 13 can be fixed without the heat treatment in consideration of the elastic modulus of the third adhesive film 23 and the process efficiency. The temperature for performing the heat treatment is preferably 100 to 200° C. and more preferably 120 to 180° C. The heat treatment time is preferably 0.25 to 10 hours and more preferably 0.5 to 8 hours.

(Second Wire Bonding Step)

Figure 1E:
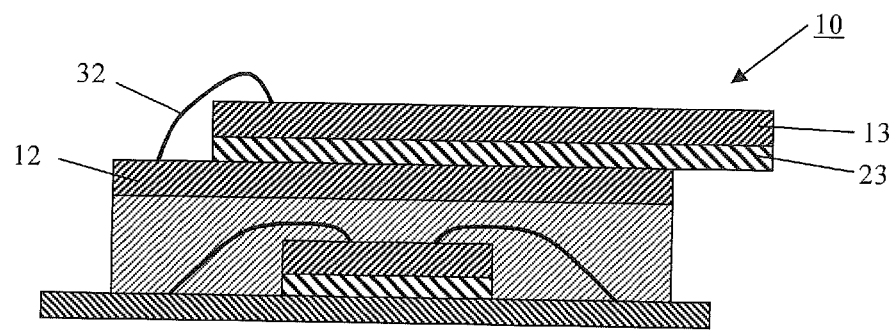

The second wire bonding step is a step of electrically connecting the electrode pad (not shown in the drawings) on the second semiconductor element 12 and the electrode pad (not shown in the drawings) on the third semiconductor element 13 by a bonding wire 32 (see FIG. 1E). The same wire material and wire bonding conditions as in the first wire bonding step can be suitably adopted in the second wire bonding step.

(Semiconductor Device)

A semiconductor device 10 in which three semiconductor elements are multistage-laminated with a prescribed adhesive film interposed therebetween can be manufactured by the above-described steps. Further, the same procedures as in the third fixing step and the second wire bonding step can be repeated to manufacture a semiconductor device in which four or more semiconductor elements are laminated.

(Sealing Step)

After a desired number of the semiconductor elements are laminated, a sealing step of sealing the entire semiconductor device 10 with a resin may be performed. The sealing step is a step of sealing the semiconductor device 10 with a sealing resin (not shown in the drawings). This step is performed to protect the semiconductor elements that are mounted on the adherend 1 and the bonding wire. This step is performed by molding a resin for sealing with a mold, for example. An example of the sealing resin is an epoxy-based resin. The resin sealing is normally performed at a heating temperature of 175° C. for 60 to 90 seconds. However, the present embodiment is not limited to this, and the sealing can be performed by curing at 165 to 185° C. for a few minutes. In this step, a pressure may be applied during resin sealing. In this case, the applied pressure is preferably 1 to 15 MPa and more preferably 3 to 10 MPa.

(Post Curing Step)

In the present embodiment, a post curing step of post-curing the sealing resin may be performed after the sealing step. The sealing resin that is insufficiently cured in the sealing step is completely cured in this step. The heating temperature in this step differs depending on the type of the sealing resin. However, it is 165 to 185° C. for example, and the heating time is about 0.5 to 8 hours. A semiconductor package can be manufactured by going through the sealing step or the post curing step.

Second Embodiment

In the first embodiment, the first semiconductor element is fixed to the adherend by the adhesive film, and the first semiconductor element and the adherend are electrically connected by wire bonding. In the second embodiment, the first semiconductor element and the adherend are fixed to each other and electrically connected by flip-chip bonding using protruded electrodes that are provided in the first semiconductor element. Therefore, the second embodiment differs from the first embodiment only in respect of the way of fixing, and the differences are mainly explained below.

(First Fixing Step)

Figure 2A:
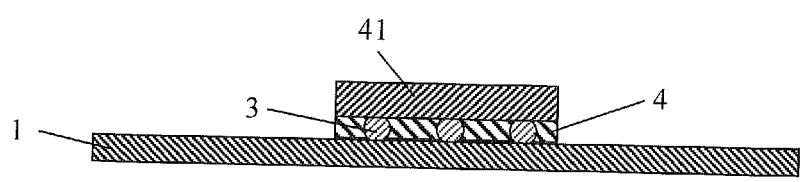
FIGS. 2A to 2D are sectional views schematically showing each step of the method of manufacturing a semiconductor device according to another embodiment of the present invention.

In the present embodiment, a first semiconductor element 41 is fixed to the adherend 1 by flip-chip bonding in the first fixing step (see FIG. 2A). In the flip-chip bonding, the circuit surface of the first semiconductor element 41 faces the adherend 1. It is so-called face down mounting. A plurality of protruded electrodes 3 such as bumps are provided in the first semiconductor element 41, and the protruded electrodes 3 and the electrodes (not shown in the drawings) on the adherend 1 are connected. The space between the adherend 1 and the first semiconductor element 41 is filled with an underfill material 4 to relieve the difference of coefficient of thermal expansion between them and to protect the space between them.

The connecting method is not especially limited, and a conventionally known flip-chip bonder can be used. For example, the protruded electrodes 3 such as bumps that are formed in the first semiconductor element 41 may be contacted and pressed against an electrically conductive material such as solder for bonding that is attached to a connection pad of the adherend 1 and the electrically conductive material is melted to ensure electrical conduction between the first semiconductor element 41 and the adherend 1 and to fix the first semiconductor element 41 to the adherend 1 (flip-chip bonding). The heating condition of flip-chip bonding is generally 240 to 300° C., and the pressurizing condition is generally 0.5 to 490 N.

The material that is used when the bump is formed as the protruded electrode 3 is not especially limited, and examples thereof include solders (alloys) such as a tin-lead-based metal material, a tin-silver-based metal material, a tin-silver-copper-based metal material, a tin-zinc-based metal material, and a tin-zinc-bismuth-based metal material; a gold-based metal material; and a copper-based metal material.

A conventionally known liquid or film-like underfill material can be used as the underfill material 4.

(Second Fixing Step)

Figure 2B:
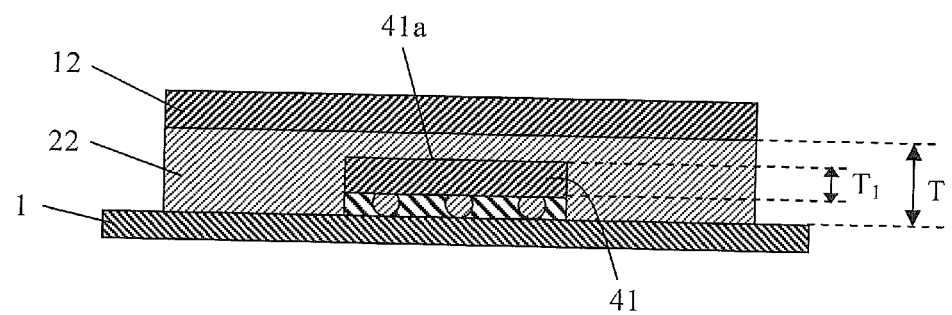

In the second fixing step, similarly to the first embodiment, a second semiconductor element 12 that is different from the first semiconductor element 41 is fixed to the adherend 1 while embedding the first semiconductor element 41 with an adhesive film 22 for embedding (see FIG. 2B). The conditions in this step are same as those in the second fixing step of the first embodiment.

The adhesive film 22 for embedding has the thickness T larger than the thickness $T_1$ of the first semiconductor element 41. Because the adherend 1 and the first semiconductor element 41 are connected by flip-chip bonding in the present embodiment, the difference between the thickness T and the thickness $T_1$ is 10 μm or more and 200 μm or less. The lower limit of the difference between the thickness T and the thickness $T_1$ is not especially limited as long as it is 10 μm or more. However, it is preferably 20 μm or more, and more preferably 30 μm or more. The upper limit of the difference between the thickness T and the thickness $T_1$ is not especially limited as long as it is 200 μm or less. However, it is preferably 150 μm or less, and more preferably 100 μm or less. With such configuration, the entire first semiconductor element 41 can be embedded inside of the adhesive film 22 for embedding while preventing contact between the first semiconductor element 41 and the second semiconductor element 12, and the first semiconductor element 41 as a controller can be fixed onto the adherend 1 (that is, fixed to the lowermost layer where the communication path length becomes shortest), together with thinning of the entire semiconductor device.

The thickness T of the adhesive film 22 for embedding can be appropriately set in consideration of the thickness $T_1$ of the first semiconductor element 41 and the height of the protruded electrodes so that the first semiconductor element 41 can be embedded. However, the lower limit thereof is preferably 50 μm or more, more preferably 60 μm or more, and further preferably 70 μm or more. The upper limit of the thickness T is preferably 250 μm or less, more preferably 200 μm or less, and further preferably 150 μm or less. By making the adhesive film 22 for embedding relatively thick, the thickness of a general controller can be almost covered, and the first semiconductor element 41 can be easily embedded in the adhesive film 22 for embedding.

Figure 2C:
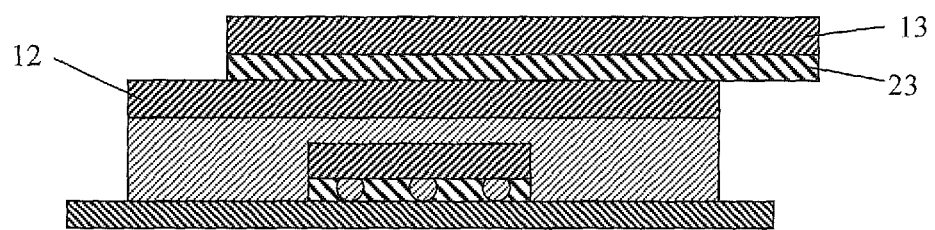
Figure 2D:
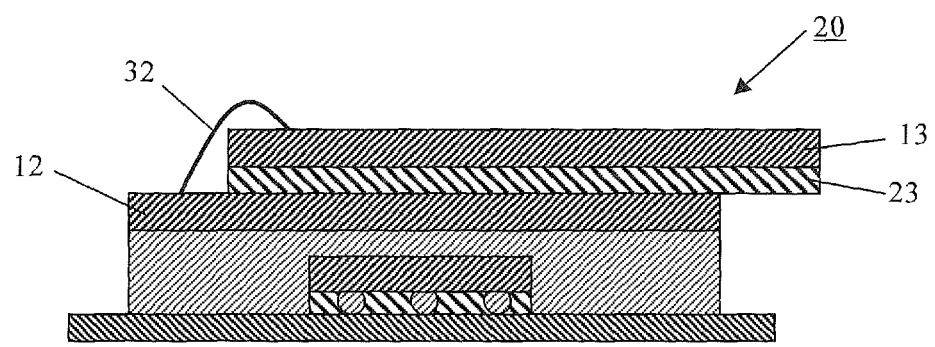

As in the first embodiment, a semiconductor device 20 in which a controller is laminated in the lowermost layer and a plurality of layers of the semiconductor elements are laminated above the controller can be manufactured by going through a third fixing step (see FIG. 2C) of fixing a third semiconductor element 13 that is of the same type with or a different type from the second semiconductor element 12 onto the second semiconductor element 12 and a second wire bonding step (see FIG. 2D) of electrically connecting the second semiconductor element 12 and the third semiconductor element 13 by the bonding wire 32.

Other Embodiments

When the semiconductor element is three-dimensionally mounted on the adherend, a buffer coating film may be formed on the surface of the semiconductor element where a circuit is formed. Examples of the buffer coating film include a silicon nitride film and a film made of a heat resistant resin such as a polyimide resin.

In each embodiment, a wire bonding step is performed every time a semiconductor element is laminated upon or after lamination of the second semiconductor element. However, it is also possible to perform the wire bonding step in a lump after laminating a plurality of semiconductor elements. The first semiconductor element cannot be an object of the lump wire bonding step because it is embedded by the adhesive film for embedding.

The mode of flip-chip bonding is not limited to the bonding by the bump as the protruded electrode explained in the second embodiment, and bonding by an electrically conductive adhesive composition, bonding by a protruded structure in which the bump and the electrically conductive adhesive composition are combined together, and the like can also be adopted. In the present invention, the mode of bonding is referred to as flip-chip bonding regardless of the difference in the bonding mode such as the protruded electrode and the protruded structure as long as it is face down mounting in which the circuit surface of the first semiconductor element faces the adherend and is connected. A conventionally known electrically conductive paste in which an electrically conductive filler such as gold, silver, or copper is mixed in a thermosetting resin such as an epoxy resin can be used as the electrically conductive adhesive composition. When the electrically conductive adhesive composition is used, the first semiconductor element is mounted on the adherend, and thereafter, a thermal curing treatment can be performed at 80 to 150° C. for about 0.5 to 10 hours to fix the first semiconductor element.

EXAMPLES

Preferred examples of the present invention are explained in detail below. However, the scope of the present invention is not limited only to the materials, the compounding amount, and the like described in the examples unless there is restrictive description in particular, and the examples are only for explanation.

Examples 1 to 8 and Comparative Examples 1 to 5

An acrylic resin, an epoxy resin A, an epoxy resin B, a phenol resin, silica, and a thermal curing catalyst were dissolved in methylethylketone at a ratio shown in Table 1 to prepare an adhesive composition having a concentration of 40 to 50% by weight.

This adhesive composition was applied onto a release-treated film made of a silicone release-treated polyethylene terephthalate film having a thickness of 50 µm as a release liner, and was dried at 130° C. for 2 minutes to produce an adhesive film each having a thickness shown in Table 1.

TABLE 1

|  | Acrylic Resin (parts by weight) | Epoxy Resin A (parts by weight) | Epoxy Resin B (parts by weight) | Phenol Resin (parts by weight) | Silica (parts by weight) | Thermal curing catalyst (parts by weight) | Film Thickness (µm) |
| --- | --- | --- | --- | --- | --- | --- | --- |
| Example 1 | 100 | 153 | 138 | 276 | 278 | 2 | 80 |
| Example 2 | 100 | 153 | 138 | 276 | 741 | 2 | 100 |
| Example 3 | 100 | 153 | 138 | 276 | 741 | 2 | 150 |
| Example 4 | 100 | 108 | 97 | 195 | 556 | 1.5 | 150 |
| Example 5 | 100 | 108 | 97 | 195 | 556 | 1.5 | 200 |
| Example 6 | 100 | 108 | 97 | 195 | 1250 | 1.5 | 250 |
| Example 7 | 100 | 108 | 97 | 195 | 1250 | 1.5 | 300 |
| Example 8 | 100 | 80 | 73 | 146 | 444 | 1.2 | 300 |
| Comparative Example 1 | 100 | 153 | 138 | 276 | 278 | 2 | 60 |
| Comparative Example 2 | 100 | 153 | 138 | 276 | 741 | 2 | 60 |
| Comparative Example 3 | 100 | 108 | 97 | 195 | 556 | 1.5 | 60 |
| Comparative Example 4 | 100 | 108 | 97 | 195 | 1250 | 1.5 | 60 |
| Comparative Example 5 | 100 | 80 | 73 | 146 | 444 | 1.2 | 60 |

The details of the abbreviations and the components in Table 1 are as follows.
Acrylic resin: SG-70L manufactured by Nagase ChemteX Corporation
Epoxy resin A: KI-3000 manufactured by Tohto Kasei Co., Ltd.
Epoxy resin B: JER 828 manufactured by Mitsubishi Chemical Corporation
Phenol resin: MEH-7851SS manufactured by Meiwa Plastic Industries, Ltd.
Silica: SE-2050MC manufactured by Admatechs Co., Ltd.
Thermal curing catalyst: TPP-K manufactured by Hokko Chemical Industry Co., Ltd.
(Measurement of Melt Viscosity)

The melt viscosity at 120° C. was measured for each of the adhesive films before thermal curing that were produced in the examples and comparative examples. The measurement was performed by a parallel plate method using a rheometer (RS-1 manufactured by HAAKE). From the adhesive film that was produced in each of the examples and comparative examples, 0.1 g of a sample was taken and placed in plates heated to 120° C. in advance. The value at 300 seconds from the start of measurement was regarded as the melt viscosity. The gap between the plates was 0.1 mm. The results are shown in Table 2.
(Production of Semiconductor Device)

An adhesive film having a composition of Example 1 was produced to have a thickness of 10 µm and used as an adhesive film for a controller chip. Each adhesive film was pasted to a controller chip of 2 mm square and 50 µm thick under the condition of a temperature of 40° C. Then, a semiconductor chip was adhered to a BGA substrate with the adhesive film interposed therebetween. The adhesion was performed at a temperature of 120° C. and a pressure of 0.1 MPa for 1 second. Then, a heat treatment was performed on the BGA substrate to which the controller chip was adhered in a dryer at 130° C. for 4 hours to thermally cure the adhesive film.

Next, wire bonding was performed on the controller chip under the following conditions using a wire bonder (trade name "UTC-1000" manufactured by Shinkawa Ltd.).

(Wire Bonding Conditions)
Temperature: 175° C.
Au-wire: 23 µm
S-LEVEL: 50 µm
S-SPEED: 10 mm/s
TIME: 15 ms
US-POWER: 100
FORCE: 20 gf
S-FORCE: 15 gf
Wire pitch: 100 µm
Wire loop height: 30 µm Each of the adhesive films that were produced in the examples and comparative examples was pasted to a semiconductor chip of 10 mm square and 100 µm thick under the condition of a temperature of 40° C. Then, a semiconductor chip was adhered to a BGA substrate while embedding the controller chip with each of the adhesive films. The adhesion was performed at a temperature of 120° C. and a pressure of 0.1 MPa for 2 seconds. Then, a heat treatment was performed on the BGA substrate to which the semiconductor chip was adhered in a dryer at 130° C. for 4 hours to thermally cure the adhesive film and produce a semiconductor device.

Each difference between the thickness T (µm) of the adhesive film and the thickness $T_1$ (µm) of the controller chip is shown in Table 2. Further, the produced semiconductor device was cut, and the cut surface was observed using an optical microscope (magnification: 200). The evaluation was performed by marking "○" for the case in which the semiconductor chip was fixed without any problems in the controller chip and "x" for the case in which deformation or damage of the controller chip was confirmed. The results are shown in Table 2.

TABLE 2

| | Film Thickness (µm) | Melt Viscosity (Pa·S) | Difference between Film Thickness T and Controller Thickness $T_1$ (µm) | Chip Lamination State in Semiconductor Device |
|---|---|---|---|---|
| Example 1 | 80 | 200 | 40 | ○ |
| Example 2 | 100 | 600 | 60 | ○ |
| Example 3 | 150 | 600 | 110 | ○ |
| Example 4 | 150 | 1000 | 110 | ○ |
| Example 5 | 200 | 1000 | 160 | ○ |
| Example 6 | 250 | 1500 | 210 | ○ |
| Example 7 | 300 | 1500 | 260 | ○ |
| Example 8 | 300 | 1800 | 260 | ○ |
| Comparative Example 1 | 60 | 200 | 20 | x |
| Comparative Example 2 | 60 | 600 | 20 | x |
| Comparative Example 3 | 60 | 1000 | 20 | x |
| Comparative Example 4 | 60 | 1500 | 20 | x |
| Comparative Example 5 | 60 | 1800 | 20 | x |

The embedding of the controller chip and the fixing of the semiconductor chip were performed well in the semiconductor devices produced using the adhesive films according to the examples. On the other hand, the deformation or breakage of the controller chip was confirmed in the semiconductor devices produced using the adhesive films according to the comparative examples, probably because the adhesive films were thin and each gap between the controller chip and the semiconductor chip was small. In the examples of the present invention, the controller chip and the BGA substrate were electrically connected by wire bonding. However, it is assumed that the same result can be obtained also in fixing by flip-chop bonding.

What is claimed is:

1. An adhesive film for embedding a first semiconductor element fixed to an adherend and fixing a second semiconductor element that is different from the first semiconductor element to the adherend, wherein
the adhesive film has a thickness T that is larger than a thickness $T_1$ of the first semiconductor element,
the adhesive film comprises an epoxy resin and a phenol resin, and
the adherend and the first semiconductor element are connected by wire bonding and a difference between the thickness T and the thickness $T_1$ is 40 µm or more and 260 µm or less, or
the adherend and the first semiconductor element are connected by flip-chip bonding and a difference between the thickness T and the thickness $T_1$ is 10 µm or more and 200 µm or less,
wherein the first semiconductor element is embedded within the adhesive film and the second semiconductor element is adhered to the adhesive film on a side of the adhesive film that is not contacting the first semiconductor element.

2. The adhesive film according to claim 1, wherein the adherend and the first semiconductor element are connected by wire bonding, and the thickness T is 80 µm or more and 300 µm or less.

3. The adhesive film according to claim 1, wherein the adherend and the first semiconductor element are connected by flip-chip bonding, and the thickness T is 50 µm or more and 250 µm or less.

4. The adhesive film according to claim 1, wherein a melt viscosity at 120° C. is 100 Pa·S or more and 2000 Pa·S or less.

5. A method of manufacturing a semiconductor device, comprising:
a first fixing step of fixing at least one first semiconductor element onto an adherend, and
a second fixing step of fixing a second semiconductor element that is different from the first semiconductor element to the adherend while embedding the first semiconductor element with the adhesive film according to claim 1,
wherein the second semiconductor element is laminated onto the first semiconductor element via the adhesive film while the first semiconductor element is embedded in the adhesive film.

6. The method of manufacturing a semiconductor device according to claim 5, wherein the first semiconductor element is fixed to the adherend with a first adhesive film for fixing the first semiconductor element in the first fixing step.

7. The method of manufacturing a semiconductor device according to claim 6, further comprising a wire bonding step of electrically connecting the first semiconductor element and the adherend by a bonding wire.

8. The method of manufacturing a semiconductor device according to claim 5, wherein the first semiconductor element is fixed to the adherend by flip-chip bonding in the first fixing step.

9. The method of manufacturing a semiconductor device according to claim 5, further comprising a third fixing step of fixing a third semiconductor element that is of the same type with or a different type from the second semiconductor element onto the second semiconductor element.

10. A semiconductor device obtained by the method of manufacturing a semiconductor device according to claim 5.

* * * * *